(12) United States Patent
Christensen et al.

(10) Patent No.: US 8,754,417 B2
(45) Date of Patent: Jun. 17, 2014

(54) VERTICAL STACKING OF FIELD EFFECT TRANSISTOR STRUCTURES FOR LOGIC GATES

(75) Inventors: Todd Alan Christensen, Rochester, MN (US); Phil Christopher Felice Paone, Rochester, MN (US); David Paul Paulsen, Dodge Center, MN (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/608,059

(22) Filed: Sep. 10, 2012

(65) Prior Publication Data

US 2013/0001701 A1 Jan. 3, 2013

Related U.S. Application Data

(62) Division of application No. 12/757,145, filed on Apr. 9, 2010, now Pat. No. 8,314,001.

(51) Int. Cl.
*H01L 29/10* (2006.01)
*H01L 29/76* (2006.01)
*H01L 31/036* (2006.01)
*H01L 31/112* (2006.01)

(52) U.S. Cl.
USPC .. 257/67; 257/69; 257/E29.126; 257/E29.127

(58) Field of Classification Search
USPC .......................................................... 257/67
See application file for complete search history.

(56) References Cited

U.S. PATENT DOCUMENTS

| | | |
|---|---|---|
| 3,535,599 A | 10/1970 | Deak |
| 4,500,905 A | 2/1985 | Shibata |
| 5,012,306 A | 4/1991 | Tasch, Jr. et al. |
| 5,093,275 A | 3/1992 | Tasch, Jr. et al. |
| 5,312,768 A | 5/1994 | Gonzalez |
| 6,392,253 B1 | 5/2002 | Saxena |
| 7,002,207 B2 | 2/2006 | Kim et al. |
| 7,282,406 B2 | 10/2007 | Grivna et al. |
| 7,355,237 B2 | 4/2008 | Lutze et al. |
| 7,537,980 B2 | 5/2009 | Son et al. |
| 7,560,379 B2 | 7/2009 | Kohli et al. |
| 7,713,828 B2 | 5/2010 | Yuki |
| 7,868,391 B2 | 1/2011 | Paone et al. |
| 8,138,054 B2 | 3/2012 | Allen et al. |
| 2002/0096690 A1 | 7/2002 | Nemati et al. |
| 2006/0054943 A1 | 3/2006 | Li et al. |
| 2006/0115944 A1* | 6/2006 | Kwak et al. ................... 438/199 |
| 2006/0252191 A1 | 11/2006 | Kammler et al. |
| 2007/0111414 A1 | 5/2007 | Chaudhry et al. |
| 2007/0181953 A1* | 8/2007 | Lyu et al. ...................... 257/382 |
| 2007/0184572 A1 | 8/2007 | Kohli et al. |
| 2009/0114997 A1 | 5/2009 | Tong et al. |
| 2009/0224368 A1 | 9/2009 | Sudo |
| 2011/0204428 A1 | 8/2011 | Erickson et al. |
| 2012/0032274 A1 | 2/2012 | Erickson et al. |

* cited by examiner

*Primary Examiner* — Daniel Whalen
(74) *Attorney, Agent, or Firm* — Robert R. Williams

(57) ABSTRACT

Vertically stacked Field Effect Transistors (FETs) are created where a first FET and a second FET are controllable independently. The vertically stacked FETs may be connected in series or in parallel, thereby suitable for use as a portion of a NAND circuit or a NOR circuit. Epitaxial growth over a source and drain of a first FET, and having similar doping to the source and drain of the first FET provide a source and drain of a second FET. An additional epitaxial growth of a type opposite the doping of the source and drain of the first FET provides a body for the second FET.

5 Claims, 12 Drawing Sheets

Completed NAND (PFETs in Parallel, NFETs in Series)

Vertical Structure formed by etching to define gate stack. Mask gate region and one end of "dog bone"; etch the other end of the "dog bone" for contact to Metal 106

Fig. 3  Deposit enough SiO$_2$ to "bury" Vertical Structure 100, then planarize

Etch SiO₂ to expose top HfO₂ and gate contacts
Holes etched to expose vertical edge of vertical structure for further processing

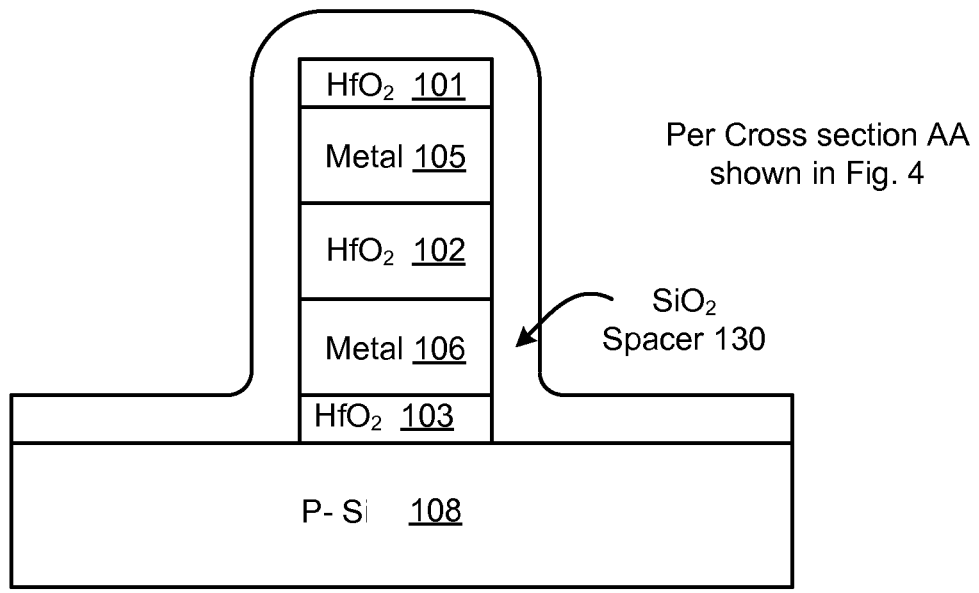
Fig. 5    Deposit Spacer
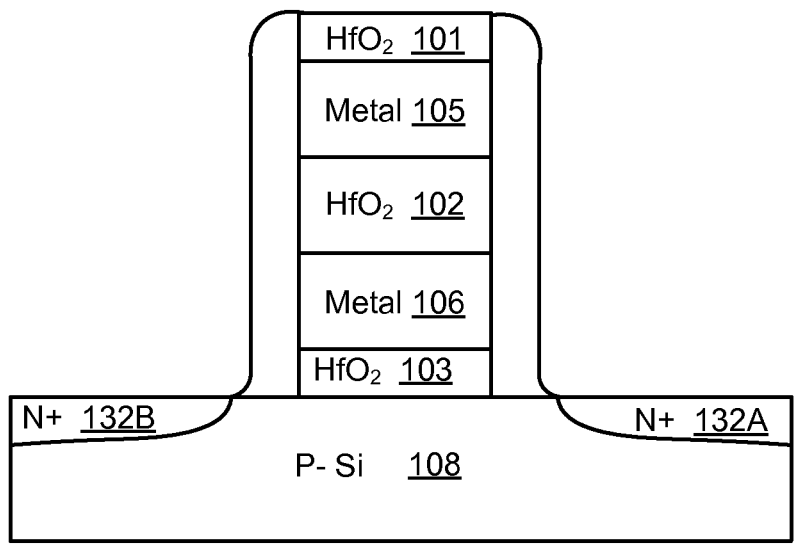
Fig. 6    Anisotropically etch spacer
Implant Source/drain

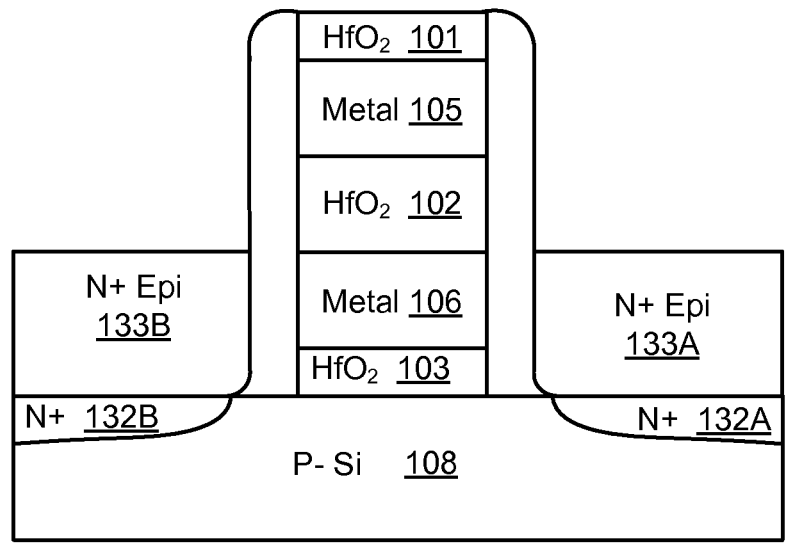
Fig. 7    Grow First Epitaxial Silicon Layer
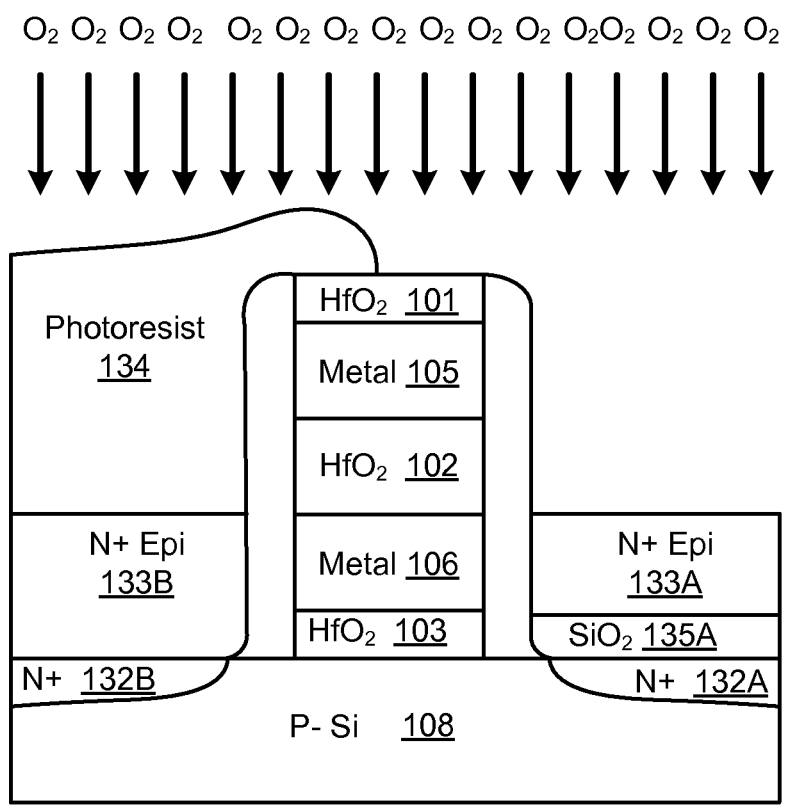
Fig. 8    Implant $O_2$ to create $SiO_2$ 135 to break a N+ 132 to N+ Epi 133 connection as shown

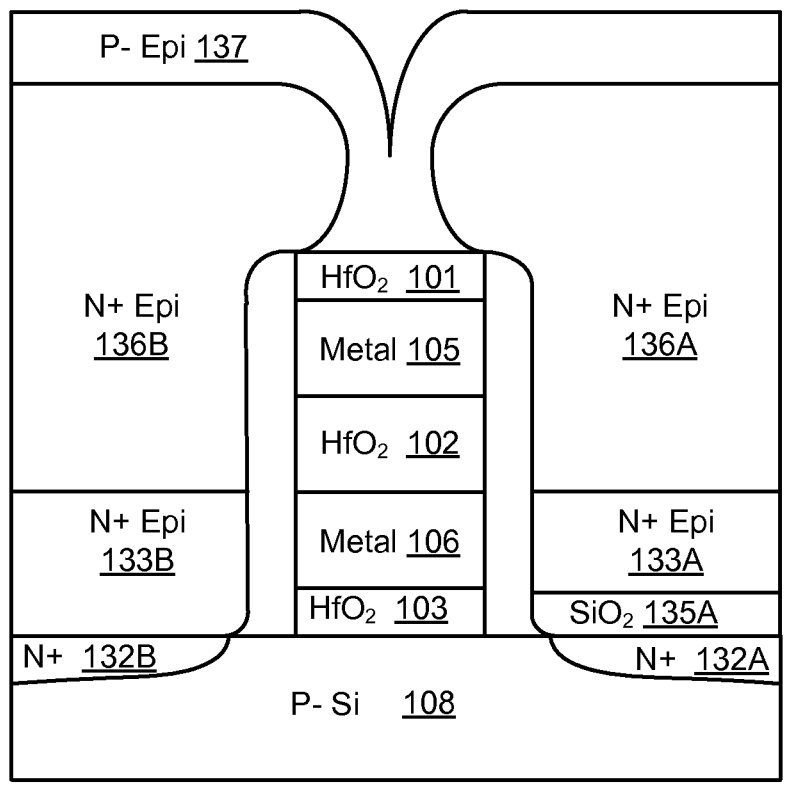
Fig. 9  Continue to grow N+ epitaxial silicon
Grow P+ epitaxial silicon
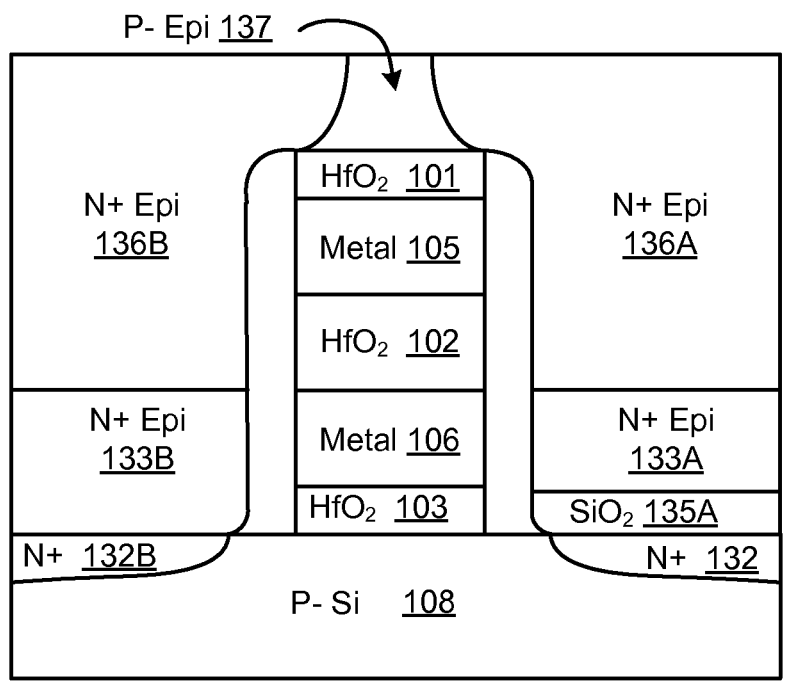
Fig. 10  Planarize

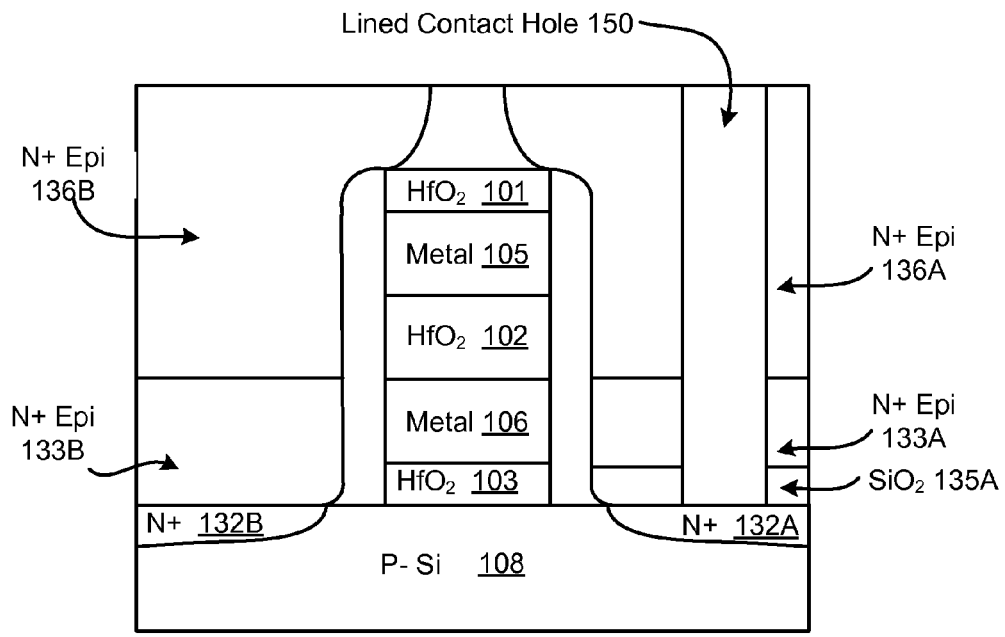
Fig. 11   Etch Lined Contact Hole
--silicon etch
--SiO₂ etch
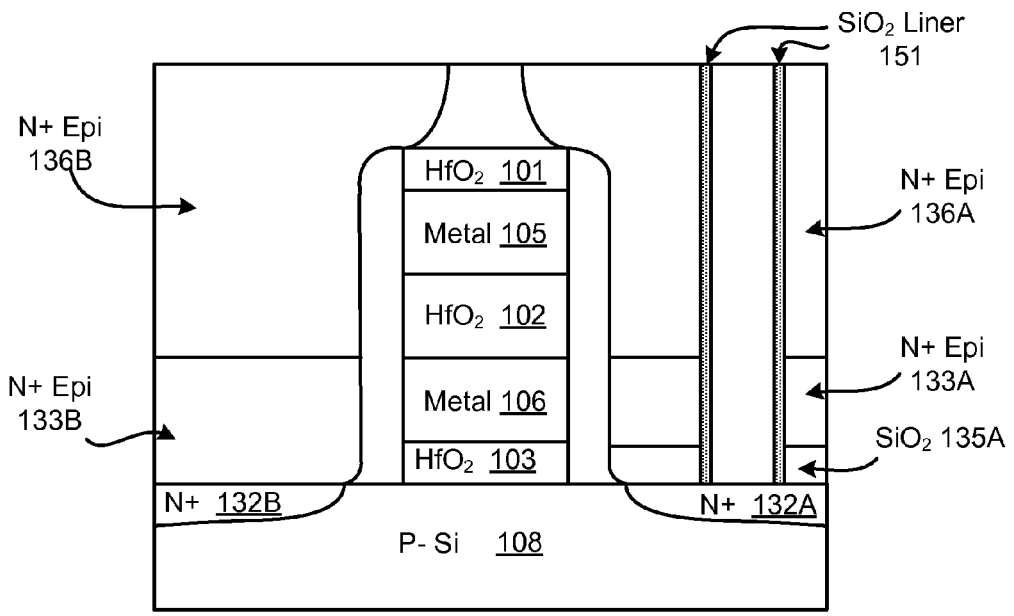
Fig. 12   Line Lined Contact hole by depositing SiO₂ Liner

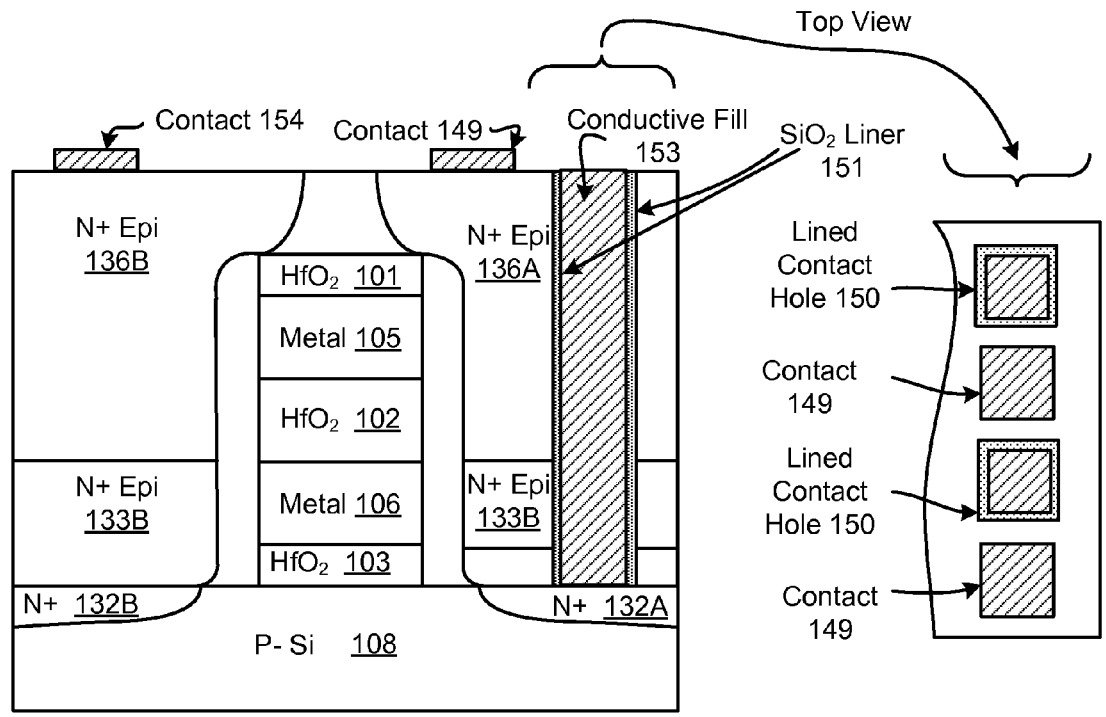
Fig. 13  Fill Lined Hole with Conductive Material
Add Contact 154 to N+ Epi 136 as shown
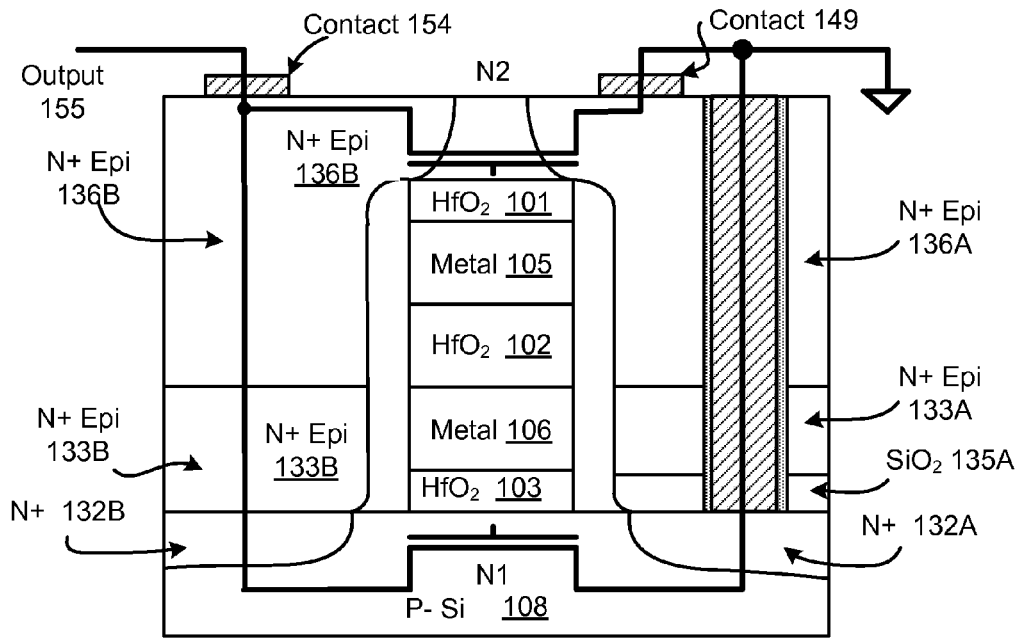
Fig. 14  Completed "NOR" Configured NFETs

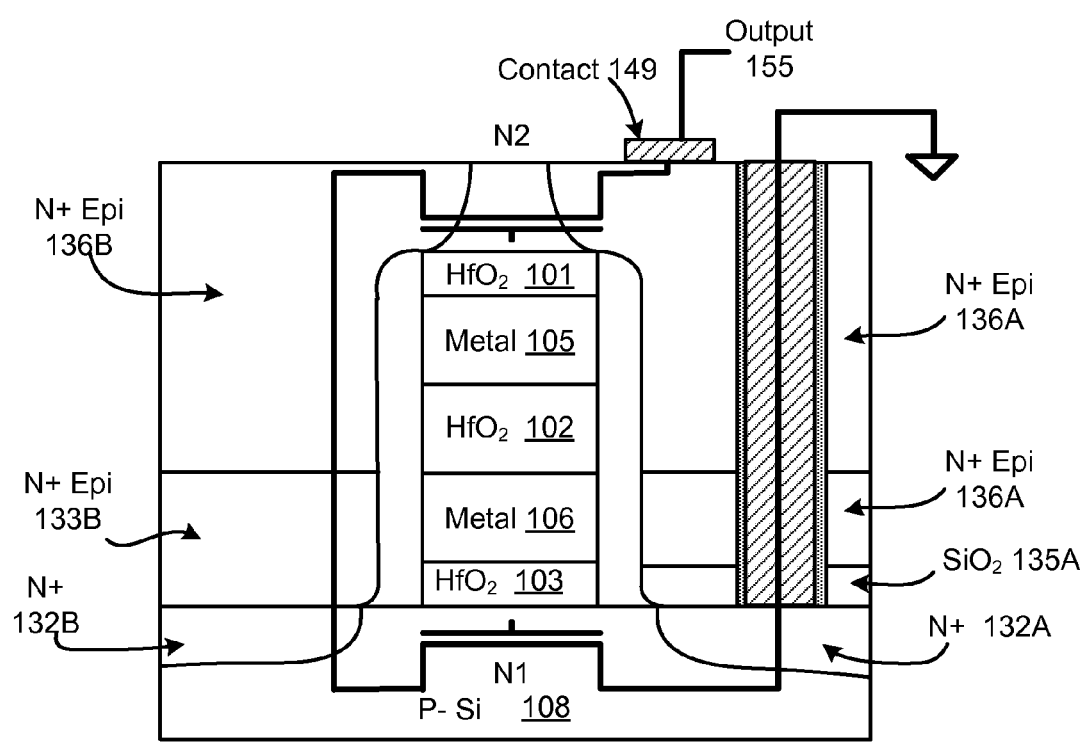
Fig. 15    Completed "NAND" Configured NFETs

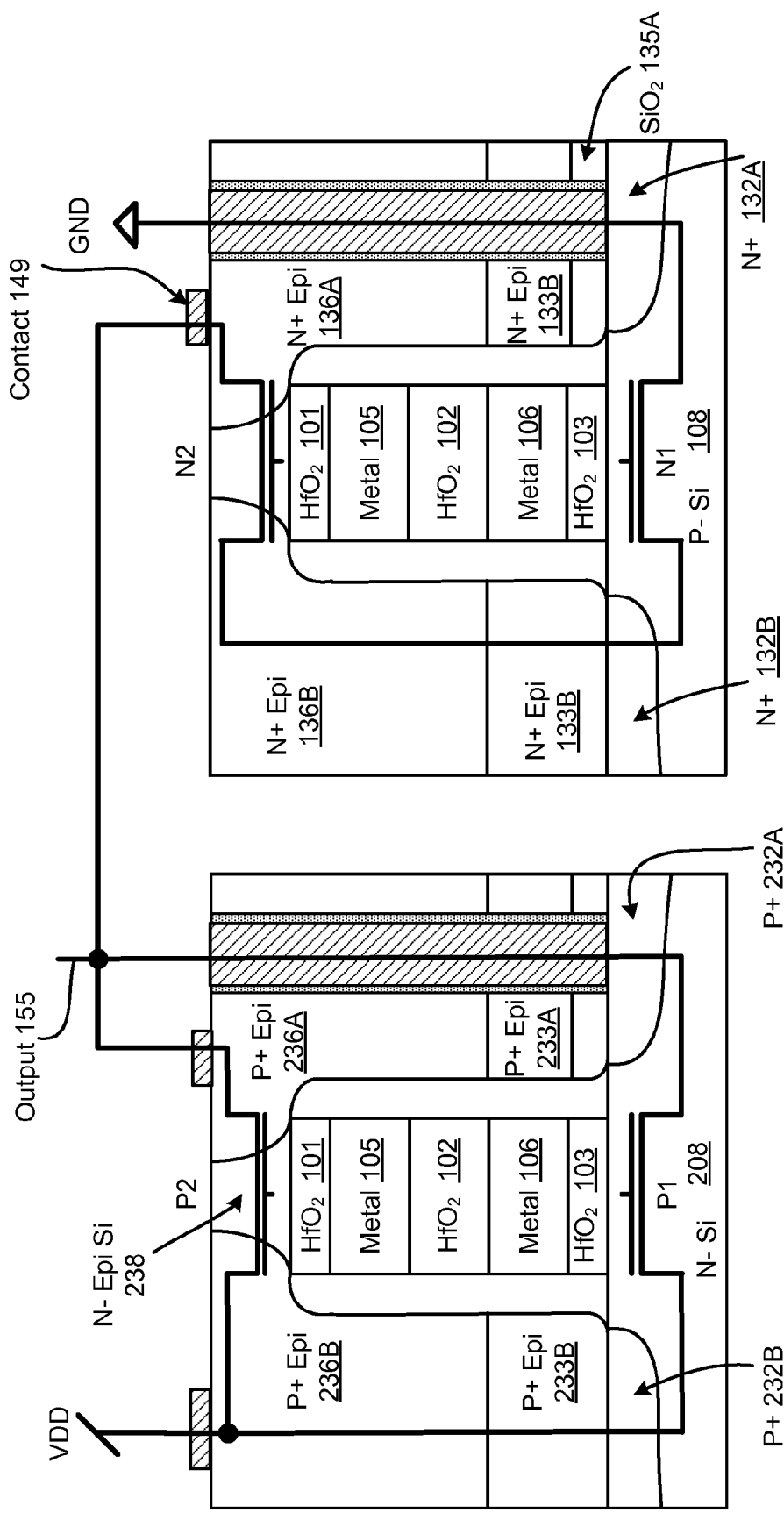
Fig. 16  Completed NAND (PFETs in Parallel, NFETs in Series)

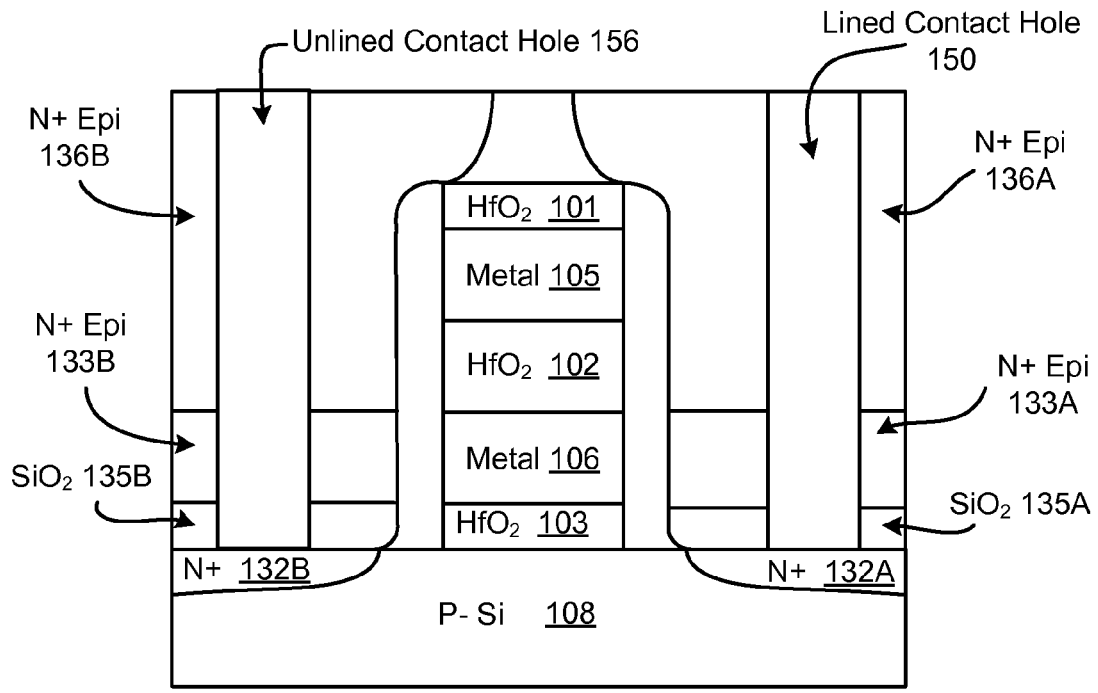
Fig. 17  Etch Lined and Unlined Contact Holes
--silicon etch
--SiO₂ etch
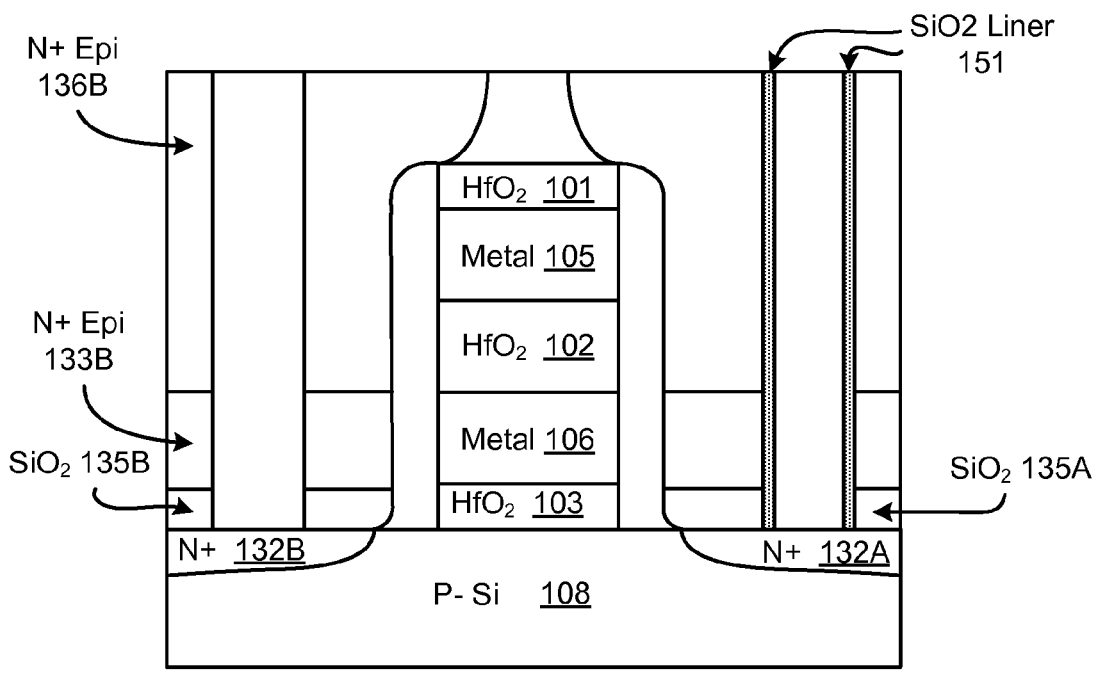
Fig. 18  Line sides of Lined Contact hole. Mask Unlined Contact Hole to Prevent Lining

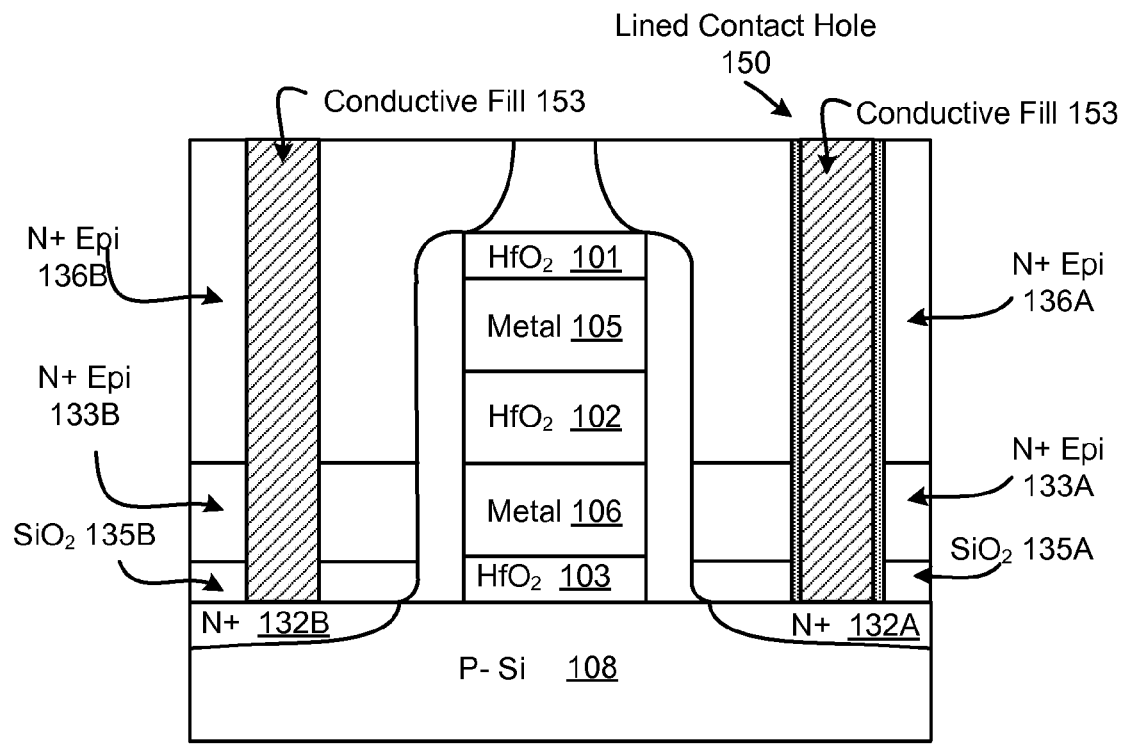
Fig. 19  Fill Lined Hole and Unlined Hole with Conductive Material
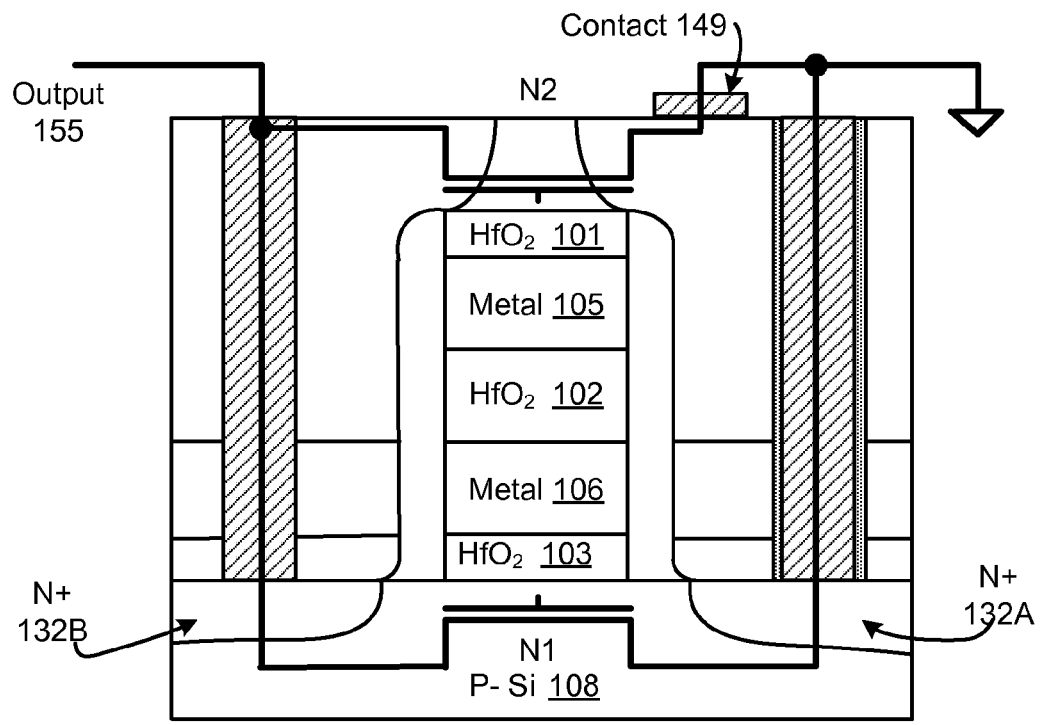
Fig. 20  Completed "NOR" Configured NFETs

VERTICAL STACKING OF FIELD EFFECT TRANSISTOR STRUCTURES FOR LOGIC GATES

This patent application is a divisional of co-pending patent application "VERTICAL STACKING OF FIELD EFFECT TRANSISTOR STRUCTURES FOR LOGIC GATES", Ser. No. 12/757,145 filed by Christensen et al. on Apr. 9, 2010, which is incorporated herein by reference.

FIELD OF THE INVENTION

This invention relates generally to Field Effect Transistors (FETs), and more particularly to vertically stacked FETs suitable for NAND and NOR configuration.

SUMMARY OF EMBODIMENTS OF THE INVENTION

Semiconductor chips are expensive to manufacture. Therefore, it is important to place as much function as possible on a semiconductor chip of a given size. Engineers constantly strive to place logic gates as densely as possible. Embodiments of the current invention vertically stack Field Effect Transistors (FETs) in order to improve density. In particular, embodiments of the invention provide for stacking N-channel Field Effect Transistors (NFETs) and for stacking P-channel Field Effect Transistors (PFETs). The NFETs are independently controllable and can be used for an NFET portion of a NAND circuit or a NOR circuit. Likewise, the PFETs are independently controllable and can be used for a PFET portion of a NAND circuit or a NOR circuit. Conventional Complementary Metal Oxide Semiconductor (CMOS) logic has NFETs arranged side-by-side and PFETs also arranged side-by-side.

Vertically stacked FETs are constructed on a semiconductor substrate. A first FET on the semiconductor substrate has a first source, a first drain, a first gate dielectric, a first body, and a first gate electrode. A second FET has a second source, a second drain, a second gate dielectric, a second body, and a second gate electrode. The first and second gate electrodes are connected to different logical signals. The second gate electrode is physically above the first gate electrode relative to a top surface of the semiconductor substrate.

BRIEF DESCRIPTION OF THE DRAWINGS

FIG. 5 shows the cross section AA identified in FIG. 4. A dielectric ($SiO_2$ shown) spacer has been conformally deposited.

FIG. 6 shows the spacer after an anisotropic etch. Source and drain areas have been implanted.

FIG. 7 shows a first growth of an epitaxial layer. The doping of the first epitaxial layer is similar to the doping of the source and drain area (i.e., if the source and drain area are N+, then the first epitaxial layer is also N+).

FIG. 8 shows an oxygen implant that creates a $SiO_2$ later isolating a source (or drain) area from the first growth of epitaxial layer. A photoresist layer may be used to prevent $SiO_2$ formation over another source (or drain) area, as shown.

FIG. 9 shows a growth of a second epitaxial layer, the second epitaxial layer doped similarly to the first epitaxial layer. A third epitaxial layer is grown over the second epitaxial layer, the third epitaxial layer being of opposite doping to the first and second epitaxial layers ("opposite doping" meaning that if, e.g., the first and second epitaxial layers are "N" doped, the third epitaxial layer being of opposite doping would be "P" doped).

FIG. 10 shows the structure of FIG. 9, planarized.

FIG. 11 shows an etching of a hole through the first and second epitaxial layers and the $SiO_2$ later of FIG. 8. This etching will be further processed to form a lined contact hole.

FIG. 12 shows the hole of FIG. 11 after deposition of a dielectric liner in the lined contact hole.

FIG. 13 shows the lined contact hole filled with a conductive fill. A contact has been made as shown for making contact to the source or drain area not contacted by the lined contact hole.

FIG. 14 shows, schematically, two NFETs (N-channel Field Effect Transistors) connected in parallel, suitable for an NFET portion of a NOR circuit.

FIG. 15 shows, schematically, two NFETs connected in series, suitable for an NFET portion of a NAND circuit.

FIG. 16 shows a completed NAND circuit having parallel-connected PFETs (P-channel Field Effect Transistors) connected in parallel and series-connected NFETs.

FIG. 17 shows an alternative structure to connect to a source or drain area using an unlined contact hole if the photoresist of FIG. 8 is not used. Holes are etched to both source and drain areas.

FIG. 18 shows the structure of FIG. 17, with the hole to one of the source and drain areas being lined with a dielectric.

FIG. 19 shows both holes etched in FIG. 17 being filled with a conductive fill.

FIG. 20 shows a schematic overlaying the structure of FIG. 19 showing two NFETs being connected in parallel, suitable for an NFET portion of a NOR gate.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide for vertical structures of field effect transistors suitable for NAND and NOR logic gates. Detailed drawings and description focus on N-channel Field Effect Transistors (NFETs); however, it will be clear that a similar process, with appropriate dopings, will create analogous PFET (P-channel Field Effect Transistors).

Figure 1:
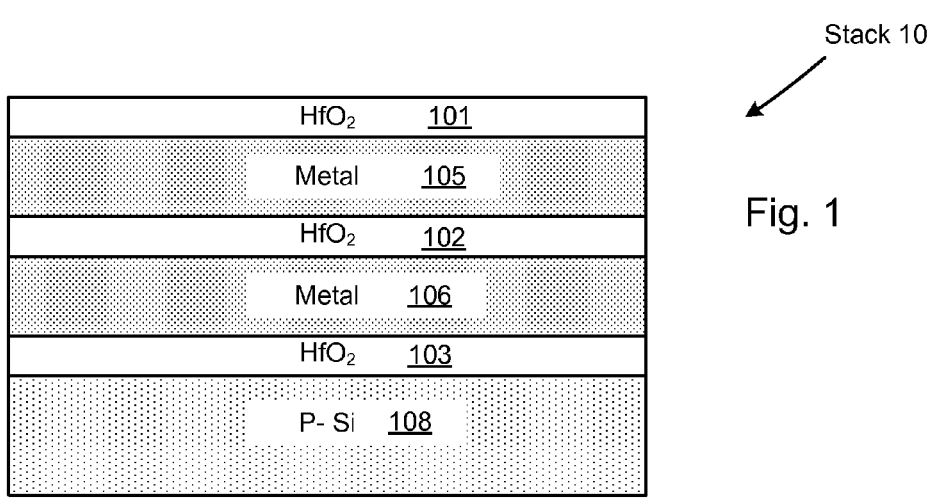
FIG. 1 shows a vertical structure having a silicon substrate (P-silicon assumed). Alternating layers of dielectric material ($HfO_2$ used for exemplary purposes) and FET gate conductor ("metal" used for exemplary purposes) are depicted.

With reference now to FIG. 1, a stack 10 comprises a silicon substrate 108, shown as being doped P-, forms a substrate for further processing of NFET transistors as will be explained below. It is understood that PFET transistors will be formed above an N-doped region, for example, an N-well in the silicon substrate 108. Alternating layers of a dielectric material ($HfO_2$ shown for exemplary purposes) and gate conductor material (e.g., metal or polysilicon; "metal" used for exemplary purposes) are stacked above silicon substrate 108. $HfO_2$ 101, 102, and 103 are shown in FIG. 1 as the dielectric layers. Metal 105 is layered between $HfO_2$ 101 and $HfO_2$ 102; Metal 106 is layered between $HfO_2$ 102 and $HfO_2$ 103. $HfO_2$ 101 and $HfO_2$ 103 will form gate oxides for a first and a second NFET and therefore need to be of appropriate thickness for gate oxide purposes. $HfO_2$ 102 electrically isolates metal 105 from metal 106 and needs to be of appropriate thickness for this purpose.

Figure 2:
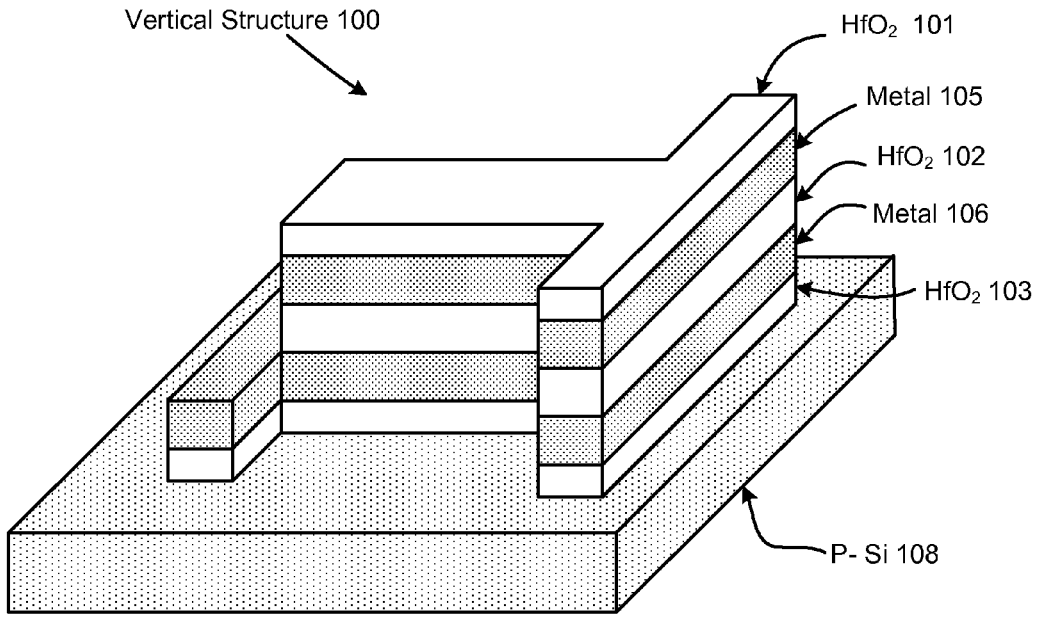
FIG. 2 shows the vertical structure of FIG. 1 in isometric style, further showing how a gate area is formed of the vertical stack. The gate area includes "dogbone" ends suitable for etching and forming contacts with the FET gate conductors.

FIG. 2 shows stack 10 after some processing in a semiconductor fabrication facility to produce a vertical structure 100. An area for NFETs shows a "dog bone" shape. A middle area of the dog bone shape is an area in which NFETs will be created. In the "dog bone", the orthogonal areas (portions) at the ends are for contacting the gate conductor material. A left orthogonal area shows $HfO_2$ 101, metal 105, and $HfO_2$ 102 etched away so that metal 106 can be contacted with dual contacts. Shapes other than "dog bones" are contemplated for dual contacts, for example, an "L" shape having a portion long enough to have a dual contact. An "L" having a shorter portion may be used if only a single contact is allowed in a particular technology. The right orthogonal area may be used to make contact(s) to metal 105 in a similar manner. For example the right and left orthogonal areas may be etched at the same time to remove a portion of $HfO_2$ 101. In subsequent etches, the left orthogonal area is further etched, as shown, while the right orthogonal area is masked to prevent further etching. Note that neither the right nor the left orthogonal "dog bone" portion needs to be etched as shown, nor is a "dog bone" required, if metal 105 or metal 106 is otherwise connected to a source of a logical signal intended to be applied as a gate voltage on an FET that is created as explained below. For example, metal 105 (or metal 106), during processing in creation of vertical stack 100, may be routed to such a signal source and therefore a "dog bone" and vias to metal 105 or metal 106 is not required.

Figure 3:
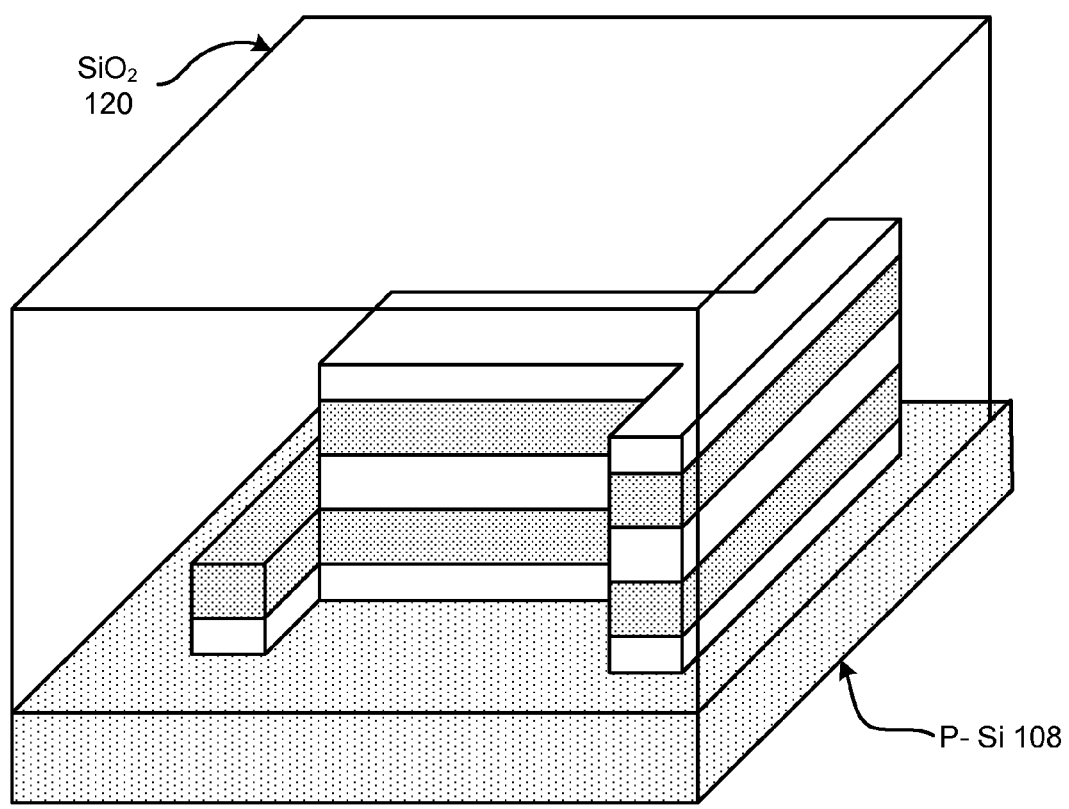
FIG. 3 shows the items in FIG. 2 further covered in silicon dioxide.

FIG. 3 shows the vertical structure 100 after further deposition of $SiO_2$ 120, or other suitable dielectric material, to cover vertical structure 100. Note that the right orthogonal "dog bone" portion is shown as not etched, whereas the left orthogonal "dog bone" portion has been etched. For example, metal 105 (referenced in FIG. 2) may be routed on the same conductor level of metal 105 to a source of a signal and therefore not require a via.

Figure 4:
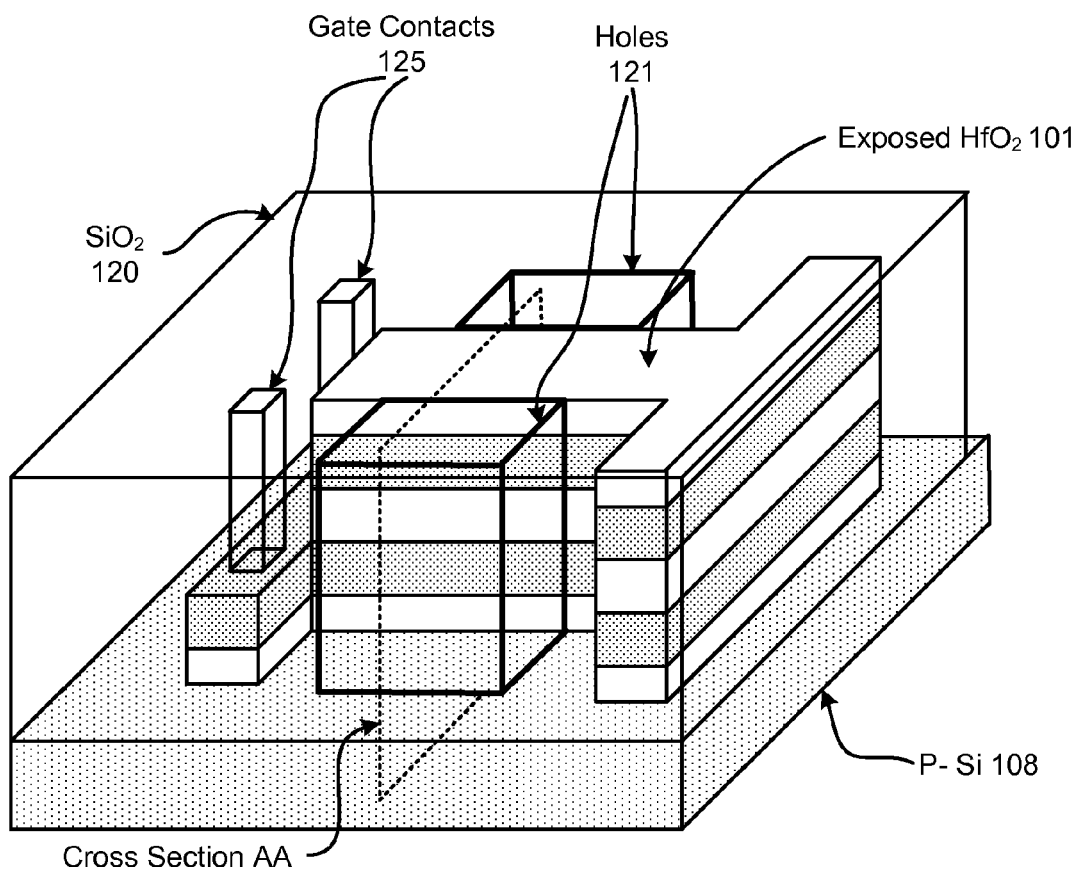
FIG. 4 shows the silicon dioxide etched to expose a top of the dielectric ($HfO_2$). Two contact holes are shown etched for making contacts to an FET gate conductor. A cross section AA is identified.

FIG. 4 shows the vertical structure 100 of FIG. 3 after etching $SiO_2$ 120 until $HfO_2$ 101 is exposed. Also, holes for gate contacts 125 provide, when filled with conductive material, contacts to metal 106. Holes 121, shown with bold lines, are etched on either side of the remaining vertical structure 100. Holes 121 provide access for subsequent processing that will, for example, deposit spacers, etch the spacers, grow epitaxial regions, as will be explained below. FIG. 4 shows cross section AA which will be used in following figures. Cross section AA cuts through a portion of the remaining vertical structure 100 and holes 121 as depicted.

FIG. 5 shows the structure of FIG. 4 at cross section AA, after conformal deposition of a $SiO_2$ spacer 130.

FIG. 6 shows the structure of FIG. 5 following an anisotropic etch of $SiO_2$ spacer 130. The anisotropic etch bares a top surface of $HfO_2$ 101 and a top surface of P—Si 108. Source/drain regions 132 (132A, 132B) are implanted into P—Si 108. At this stage of the process, source/drain regions 132 are the source/drains of a first NFET; $HfO_2$ 103 is a gate dielectric of the first NFET; metal 106 is a gate electrode of the first NFET.

Source/drain regions 132A and 132B are created by the same implant processing step and are generically called source/drain regions 132. However, for clarity as to which source/drain region is intended, a suffix "A" is appended to 132 for the "right hand" (in the drawing) source/drain region 132, and a suffix "B" is appended to 132 for the "left hand" source/drain region 132. A similar convention is used hereinafter to designate "left hand" and "right hand" portions of a particular element.

FIG. 7 shows the structure of FIG. 6 with addition of N+ Epi 133 grown over source/drain regions 132. Note the "right hand" and "left hand" "A", "B" suffix convention. N+ Epi 133 has a doping similar to doping of source/drain regions 132. That is, if source/drain regions 132 are doped "N", N+ Epi 133 is also doped "N", with appropriate concentration of dopants.

While detail is given herein for creation of NFETs, it will be understood that PFETs may be created in a similar manner, for example starting with an N-Nwell in P—Si 108, P+ implantation forming source/drain regions for a PFET, and P+ epitaxial growth of the source/drain regions of the PFET.

FIG. 8 shows the structure of FIG. 7 with addition of photoresist 134 and an oxygen implant of suitable energy to create $SiO_2$ 135A over source/drain region 132A. Photoresist 134 blocks the oxygen implant from forming a $SiO_2$ 135B over source/drain region 132B, as shown in FIG. 7. $SiO_2$ 135A electrically isolates source/drain region 132A from an overlying N+ epi 133A. Source/drain region 132B remains in electrical connection with similarly doped overlying N+ epi 133B.

FIG. 9 shows the structure of FIG. 8 with addition of continued growth of suitably doped epitaxial silicon, N+ epi 136, shown as N+ epi 136A, 136B. N+ epi 136 is grown over N+ epi 133 until N+ epi 136 grows above the top surface of $HfO_2$ 101. N+ epi 136 will "bulge" slightly over the spacer and a portion of $HfO_2$ 101, as shown. P-epi 137 is grown on N+ epi 136, as depicted. P-epi 137 is grown until the top surface of $HfO_2$ 101 is covered to a suitable depth for a body of a second NFET. The P-epi 137 is of opposite doping to the N+ doping of N+ epi 136, where opposite doping means "P" doping versus "N" doping, with appropriate concentration of dopants for the intended purpose.

N+ epi 133 and N+ epi 136 may be considered a single epitaxial layer. The two-part growth facilitates the oxygen implant to form $SiO_2$ 135A.

FIG. 10 shows the structure of FIG. 9, following planarization. The planarization removes P-epi 137 except for an area above the top surface of $HfO_2$ 101. The remaining P-epi 137 forms a body of a second NFET; $HfO_2$ 101 forms a gate dielectric of the second NFET. N+ epi 136 forms source/drain regions N+ epi 136A and 136B for the second NFET; metal 105 forms a gate electrode of the second NFET.

FIG. 11 shows the structure of FIG. 10 following etching of a lined contact hole 150. Lined contact hole 150 is formed by an etch through N+ epi 136A and N+ epi 133A, followed by a second etch through $SiO_2$ 135A.

FIG. 12 shows the structure of FIG. 11 following deposition of a dielectric material lining around the vertical surfaces of lined contact hole 150. The dielectric material lining is shown as $SiO_2$ liner 151. $SiO_2$ liner 151 may, in embodiments, use a dielectric other than $SiO_2$, so long as the dielectric is compatible with the processing steps described herein. Deposition of $SiO_2$ liner 151 will also form $SiO_2$ on source/drain region 132A, and that SiO$_2$ is removed by etching so that source/drain region 132A is exposed under lined contact hole 150.

FIG. 13 shows the structure of FIG. 12 following addition of conductive fill 153 in lined contact hole 150. SiO$_2$ 135A and SiO$_2$ liner 151 electrically isolates the source/drain region 132A from the N+ epi 133A and N+ epi 136A. Contact 154 is added, as shown, on N+ epi 136B. Contact 154 is effectively connected to source/drain region 132B through N+ epi 133B and N+ epi 136B. In FIG. 13, a contact 149 is made to the N+ epi 136A, and, in an embodiment, contact 149 may be placed as shown, that is, closer to the second NFET than is the lined contact hole 150. However, in other embodiments, one or more lined contact holes 150 may be alternated with one or more contacts 149 as shown in the "top view" in FIG. 13, wherein the one or more lined contact holes 150 are approximately lined up with contacts 149 in order to make the layout more compact.

FIG. 14 shows the structure of FIG. 13, including a schematic of a first NFET N1 and a second NFET N2 overlaid on the structure of FIG. 13. Contact 149 is shown not "lined up" with the lined contact hole 150 in order to more clearly and completely show connections. Sources of N1 and N2 are shown connected to ground; drains of N1 and N2 are shown connected together at node output 155. Gate controls of N1 (metal 106) and N2 (metal 105) are independent, assuming that metal 106 and metal 105 are connected to independent logical sources. In FIG. 14, N1 and N2 are connected as NFETs are in a logical NOR configuration; that is, if either N1 or N2 is "on", output 155 will be pulled to Gnd.

FIG. 15 shows N1 and N2 connected in series, as NFETs are connected in a NAND configuration. Output 155 will be pulled to Gnd if logical signals on both metal 105 and metal 106 are at high logical levels (e.g., Vdd) so that both N1 and N2 are "on".

FIG. 16 shows a completed NAND, with PFETs P1 and P2 having sources connected to Vdd and drains connected to output 155. NFETs N1 and N2 are connected as shown in FIG. 15; that is, N1 and N2 are connected in series between output 155 and Gnd. PFETs P1 and P2 are created, as described earlier, in a manner similar to that used in creation of N1 and N1, but built over an N-well N—Si 208, with PFET source/drain regions 232 doped P+ further designated 232A and 232B implanted in N—Si 208. Again, note that suffix "A" is appended to "right hand" portions of the PFET structure; "B" is added to the "left hand" portions so that those portions can be clearly identified when needed. PFET processing, similar to the detailed NFET processing creates a P+ epi 233, a P+ epi 236, and an N-epi 238. Appropriate interconnections of gate electrodes are created on metal 105 and metal 106 (or, through vias, other conducting levels) to provide logical values on the gates of N1, N2, P1, and P2. For example, Metal 105 of N2 is connected to metal 105 of P2; metal 106 of N1 is connected to metal 106 of P1. The connections may be done on those metal levels (i.e., metal 105 and metal 106) or through vias such as gate contacts 125 shown in FIG. 4 to other wiring levels suitable for circuit interconnect from the metal 105 and 106 gate electrodes of N1, N2, P1, and P2. Whereas FIG. 16 explicitly depicts a NAND, a NOR configuration may be configured by connecting N1 and N2 as shown in FIG. 14, and having P1 and P2 connected in series between Vdd and output 155 in a manner similar to the series N1 and N2 shown in FIG. 15.

Whereas N1 has been shown earlier as having a lined contact hole 150 to connect to the source/drain region 132A, and relying on a low impedance path through similarly doped silicon areas (N+ 132B, N+ Epi 133B, and N+ Epi 136B) to connect source/drain region 132B to contact 154 (FIG. 13), in another embodiment, shown in FIGS. 17-20, photoresist 134 (FIG. 8) is not used, and therefore the oxygen implant creates a SiO$_2$ 135 (135A, 135B) barrier above both source/drain regions 132A and 132B. FIG. 17 shows both lined contact hole 150 and unlined contact hole 156 being created at the same time using a silicon etch to etch through N+ epi 136A and 136B and N+ epi 133A and 133B, followed by an oxide etch through SiO$_2$ 135A and 135B. In FIG. 18, SiO$_2$ liner 151 is created in lined contact hole 150, but a mask over unlined contact hole 156 prevents creation of a similar SiO$_2$ liner 151 being formed in unlined contact hole 156. FIG. 19 shows both lined contact hole 150 and unlined contact hole 156 being filled with a conductive fill 153. Conductive fill 153 may be a metal, such as tungsten, or a suitably doped polysilicon fill. A polysilicon fill would typically make a higher resistance contact than a metal fill. Note that one or more contacts 149 "in-line" (see top view portion of FIG. 13) is assumed in FIG. 19, so that N+ epi 136A can be contacted, but do not appear in FIG. 19 because they would be "behind" the lined contact hole 150. In an alternative embodiment, a second lined contact hole may be used in place of the unlined contact hole 156 shown in FIG. 17 and carried through FIGS. 17-20; however, one or more contacts such as contact 149 shown in FIG. 20 would be required to contact a drain of N2 (i.e., N+ Epi 136B) to output 155.

FIG. 20 shows the structure of FIG. 19 overlaid with a schematic of N1 and N2 connected in a NOR configuration; that is, if either N1 or N2 is turned on (i.e., if either the voltage on gate electrode metal 105 (for N2) is high, or the voltage on gate electrode metal 106 (for N1) is high) output 155 is pulled to Gnd. PFETs to complete the NOR would be as in FIG. 16, with one or more unlined vias used to contact 232B. If a lined via is used in the PFET structure, a contact would also need to be made to P+ Epi 236B.

What is claimed is:

1. An apparatus comprising:
   a semiconductor substrate;
   a first Field Effect Transistor (FET) on the semiconductor substrate, the first FET further comprising a first source, a first drain, a first gate dielectric, a first body, and a first gate electrode, the first gate electrode coupled to a first source of a first logical signal;
   a second FET, the second FET further comprising a second source, a second drain, a second gate dielectric, a second body, and a second gate electrode, the second gate electrode coupled to a second source of a second logical signal, the second source of the second logical signal not being the first source of the first logical signal, the second gate electrode being above the first gate electrode relative to a top surface of the semiconductor substrate;
   a first epitaxial layer of similar doping as the first drain and the first source, the first epitaxial layer grown over the first drain and the first source;
   an oxide created over the first source to electrically isolate the first source from the first epitaxial layer over the first source; and
   a second epitaxial layer of opposite doping as the first drain and the first source grown over the first epitaxial growth, the first epitaxial layer comprising the second drain and the second source, and the second epitaxial growth forming the second body.

2. The apparatus of claim 1, wherein the first FET in an N-channel Field Effect Transistor (NFET) and the second FET is an NFET.

3. The apparatus of claim 1, wherein the first FET is a P-channel Field Effect Transistor (PFET) and the second FET is a PFET.

4. The apparatus of claim 1 further comprising a lined contact hole passing through the first epitaxial layer and the oxide for providing electrical connection to the first source.

5. The apparatus of claim 4, further comprising:
- the first source electrically connected to the second source; and
- the first drain electrically connected to the second drain;
- the second drain electrically connected to an output;
- the first source further electrically connected to a first voltage source;
- a third FET of type opposite to the first and second FETs, having a third source, a third drain, and a third gate electrode;
- a fourth FET of same type as the third FET, having a fourth source, a fourth drain, and a fourth gate electrode;
- the third source electrically connected to a second voltage source;
- the third drain electrically connected to the fourth source; and
- the fourth drain connected to the output.

* * * * *